United States Patent [19]

Cartwright, Jr.

[11] Patent Number: 4,652,773

[45] Date of Patent: * Mar. 24, 1987

[54] INTEGRATED CIRCUITS WITH ELECTRICALLY ERASABLE ELECTRICALLY PROGRAMMABLE LATCH CIRCUITS THEREIN FOR CONTROLLING OPERATION

[75] Inventor: James M. Cartwright, Jr., Highland Park, N.J.

[73] Assignee: RCA Corporation, Princeton, N.J.

[ * ] Notice: The portion of the term of this patent subsequent to Jun. 24, 2003 has been disclaimed.

[21] Appl. No.: 858,024

[22] Filed: May 1, 1986

Related U.S. Application Data

[63] Continuation of Ser. No. 627,920, Jul. 5, 1984, Pat. No. 4,596,938, which is a continuation-in-part of Ser. No. 429,468, Sep. 30, 1982, abandoned, and Ser. No. 458,665, Jan. 17, 1983, abandoned.

[51] Int. Cl.[4] ..................................... H03K 19/094
[52] U.S. Cl. .................................. 307/469; 307/279; 307/450; 307/451; 307/585; 364/716
[58] Field of Search ............... 307/443, 450, 451, 463, 307/465, 468, 469, 471, 279, 291, 584–585; 364/716; 365/95, 103, 104, 185

[56] References Cited

U.S. PATENT DOCUMENTS

| | | | |
|---|---|---|---|
| 4,481,432 | 11/1984 | Davies, Jr. | 307/469 |
| 4,495,427 | 1/1985 | Cartwright, Jr. | 307/451 X |
| 4,567,385 | 1/1986 | Falater et al. | 307/451 X |

OTHER PUBLICATIONS

"Now a Single Chip Can Hold a Reprogrammable System", *Electronics*, 3/10/86, p. 14.

Primary Examiner—Stanley D. Miller
Assistant Examiner—D. R. Hudspeth
Attorney, Agent, or Firm—Joseph S. Tripoli; Allen L. Limberg

[57] ABSTRACT

Integrated circuitry including at least one electrically erasable electrically programmable latch circuit. The contents of each latch circuit can be altered by applying programming voltages to the same terminals of the integrated circuitry that are used for other functions during times of normal operation. Each latch circuit provides localized memory for controlling the configuration of the integrated circuitry during times of normal operation, rather than depending upon memory external to the integrated circuitry for controlling the configuration of the integrated circuitry.

3 Claims, 13 Drawing Figures

NOTE:
* CHANNELS OF 37 & 38 MAY BE REVERSED BETWEEN $V_{SS}$ & $V_{DD}$
** 32 MAY BE OMITTED IF GATE OF 16 TIES TO TERMINAL 34 RATHER THAN TO TERMINAL 13
*** 35 & 36 MAY BE OMITTED AND TERMINALS 34 & 12 TIED

1 …

INTEGRATED CIRCUITS WITH ELECTRICALLY ERASABLE ELECTRICALLY PROGRAMMABLE LATCH CIRCUITS THEREIN FOR CONTROLLING OPERATION

The government has rights in the invention pursuant to Contract No. DAAK 20-80-C-0292 awarded by the Department of the Army.

This is a continuation of application Ser. No. 627,920 filed July 5, 1984 and issued June 24, 1986 as U.S. Pat. No. 4,596,938, which is a continuation-in-part of application Ser. No. 429,468 filed Sept. 30, 1982 and of application Ser. No. 458,665 filed Jan. 17, 1983, which latter two applications are now abandoned.

The present invention relates to electrically erasable, electrically programmable electronic circuits for handling digital or analog signals.

BACKGROUND OF THE INVENTION

J. E. Annis in his U.S. Pat. No. 3,500,062 issued Mar. 10, 1970 and entitled DIGITAL LOGIC APPARATUS, included herein by reference, describes complementary-symmetry metal-oxide-semiconductor (COS/MOS or, more simply, CMOS) exclusive-OR and exclusive NOR gates. In these circuits a first of two logic input signals is applied to a simple CMOS push-pull pair logic inverter to obtain its logical complement. This first logic input signal and its complement are then used to selectively enable either a transmission gate or a CMOS push-pull pair logic inverter. When the transmission gate is enabled, it passes the second logic input signal without inversion to the logic output of the gate. When the logic inverter is enabled, it provides inverted response to the second logic input signal at the logic output of the gate.

Recently, field effect transistors have been developed which have electrically alterable threshold voltages, or $V_T$s, which can be programmed by applying voltages between the gate and one of the other electrodes of the device, which voltages exceed those used as normal logic or signal levels. Thereafter, non-volatile memory in these FETs retains the programmed threshold voltage. The present inventor in his U.S. patent application Ser. No. 213,361, filed Dec. 5, 1980 and entitled PROGRAMMABLE LOGIC GATES AND NETWORKS, abandoned in favor of a like-titled application filed Mar. 20, 1983, patented Jan. 22, 1985 as U.S. Pat. No. 4,495,427, and incorporated herein by reference, describes programming the threshold voltages of such devices for conditioning them to be strongly enhancement-mode or strongly depletion-mode in their characteristics, thereby to function as either open- or short-circuits to programmably interconnect CMOS field effect transistors into logic gates or networks of logic gates. The programming of the threshold of these devices is carried on by application of programming voltages via the same input terminals used for normal logic inputs. This use of two different regimes of signal for different purposes, but applying them through the same terminals, is referred to as "reflex" operation.

SUMMARY OF THE INVENTION

The present invention in one of its aspects is embodied in an input stage for CMOS integrated circuits which selectively does invert or does not invert signals applied to its input terminal. Programming voltages for determining which mode of operation is to obtain preferably are reflexed through the input terminal. The programming voltages are applied to the gates of a pair of programmable-threshold-voltage FETS arranged in a programmable latch configuration. The channels of these FET's selectively connect a latch output connection to a respective one of two operating voltages. Such programmed latches, per se, are another aspect of the invention. In still another aspect of the invention the latch condition and its complement are applied to control conduction of a CMOS transmission gate. In still another aspect of the invention the latch condition and its complement are used to control application of source voltages to a CMOS logic inverter pair. A transmission gate and a selectively powered logic inverter can be alternately enabled responsive to the latch condition and its complement in embodiments of another aspect of the invention.

BRIEF DESCRIPTION OF THE DRAWING

In the drawing an FET with programmable threshold voltage (or $V_T$) is shown with an additional bar between the two bars respectively signifying the gate electrode and channel portions of the FET, which latter two bars are found in the conventional metal-insulator-semiconductor FET symbol. Where the programmable-$V_T$ transistor is programmable like one of gate-injection type (e.g., is a GIMOS transistor), the space between the additional bar and the bar representing the gate electrode is stippled. Where the programmable-$V_T$ transistor is programmable like one of substrate injection type (e.g., is a SIMOS transistor), the space between the additional bar and the bar representing the channel is stippled. Where the spaces between the additional bar and its flanking two bars are free of stipple, the programmable-$V_T$ transistor is programmable the same as other programmable-$V_T$ transistors (of either programming type) appearing in the same figure.

In the drawing.

Figure 1:
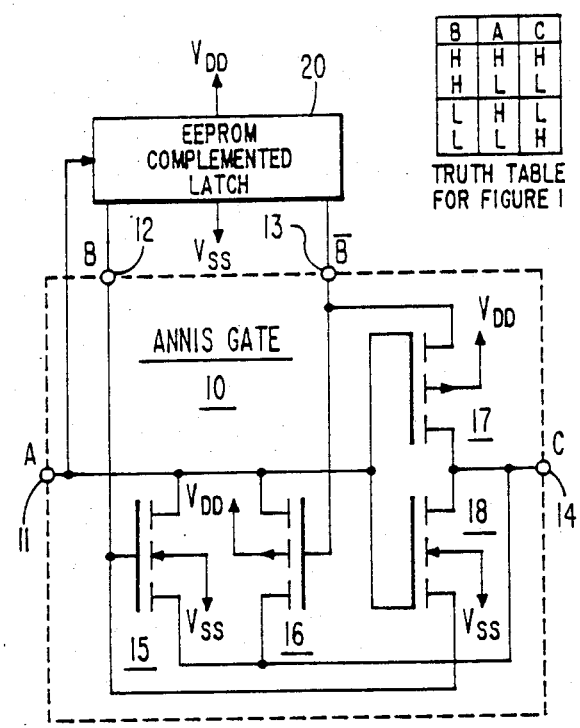
FIG. 1 is a schematic diagram, partially in block form, of an electrically erasable programmable Annis gate in accordance with an aspect of the invention.
Figure 4:
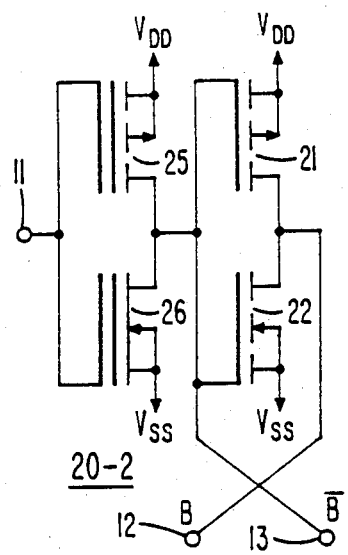
Figure 5:
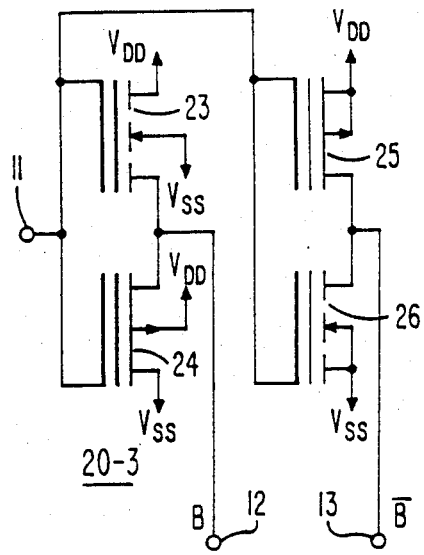
Figure 6:
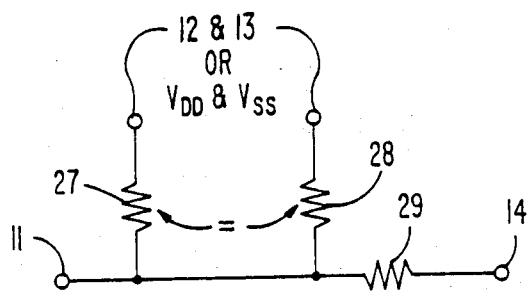
Figure 7:
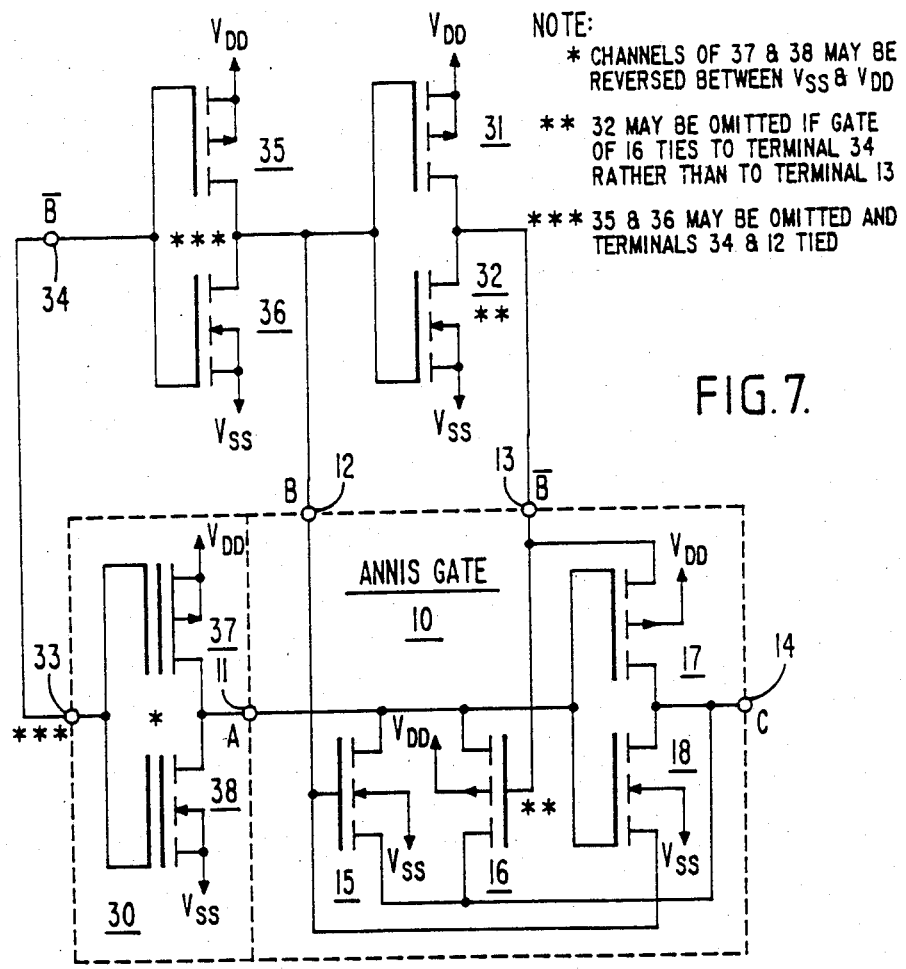

each of FIGS. 3, 4, and 5 is a schematic diagram of a different form the electrically erasable programmable non-volatile memory portion of the FIG. 1 circuit may take in accordance with different embodiments of the invention, each using at least one pair of complementary-conductivity programmable-threshold-voltage FETs;

FIG. 6 is a modification to the FIG. 1 circuit adapting it for programmably inverting or not inverting analog signals;

FIG. 7 is a schematic diagram of alternatives for the FIG. 1 circuitry embodying the invention in others of its aspects; and each of FIGS. 8–13 is a schematic diagram of still different forms the electrically erasable programmable non-volatile memory portion of the FIG. 1 circuit may take, in accordance with different embodiments of the invention, each form using at least one pair of similar-conductivity programmable-threshold-voltage FET's.

Figure 2:
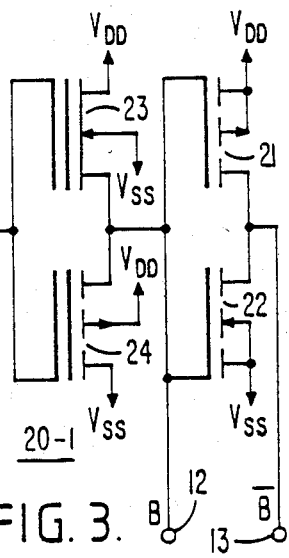
FIG. 2 is a truth table for the Annis gate.

In FIG. 1, an Annis gate 10 is arranged for receiving a logic variable A on its input terminal 11 from a source not explicitly shown and for receiving another logic variable B and its complement $\overline{B}$ on its input terminals 12 and 13, respectively. Logic response $C = A \oplus B$ appears at output terminal 14 of gate 10 in accordance with FIG. 2 truth table, wherein the letters H and L refer respectively to high and to low logic conditions. The symbol ⊕ signifies the exclusive-NOR response to A and B.

The departure from prior art practice in the operation of Annis gate 10 is that the B and $\overline{B}$ logic variables are supplied from a complemented latch circuit 20 which includes electrically erasable programmable read only memory (EEPROM) elements, and the logic conditions B and $\overline{B}$ are specified in accordance with programming signals applied to terminal 11 at an earlier time. This means the Annis gate 10 can be programmed by application of a programming potential outside the normal range of logic signals to subsequently generate C either equal to A or to $\overline{A}$. The limits of a normal range of logic signals may be a relatively low voltage L which may equal supply voltage $V_{SS}$ and a relatively high voltage H which may equal supply voltage $V_{DD}$.

In Annis gate 10 an n-channel enhancement-mode field effect transistor 15 and a p-channel enhancement-mode field effect transistor 16 are connected together as a complementary-pair transmission gate between terminals 11 and 14. When latch 20 supplies B=H and $\overline{B}$=L, B being high biases the gate of n-channel FET 15 to tend to be conductive for A<H, and $\overline{B}$ being low biases the gate of p-channel FET 16 to tend to be conductive for A>L. The transmission gate connection of FETs 15 and 16 between terminals 11 and 14 is conductive over the entire range of normal logic levels bounded by H and L, so C=A. When latch 20 supplies B=L and $\overline{B}$=H, B being low fails to bias the gate of n-channel FET 15 to be conductive at any logic level in the normal range, and $\overline{B}$ being high fails to bias the gate of p-channel FET 16 to be conductive at any logic level in the normal range. The transmission gate connection of FETs 15 and 16 between terminals 14 and 11 is therefore non-conductive.

In Annis gate 10, a p-channel enhancement-mode FET 17 and an n-channel enhancement-mode FET 18 have their gates connected at input terminal 11 and their drains connected at output terminal 14. When the sources of p-channel FET 17 and of n-channel FET 18 to which $\overline{B}$ and B are respectively applied are high and low, respectively, a complementary-pair logic-inverter stage is enabled between input terminal 11 and output terminal 14. So C=$\overline{A}$. (Conventionally in CMOS logic design, the logic levels L and H are closer together in voltage than the sum of the threshold voltages of the p-channel and n-channel enhancement mode FETs used to implement the design. This reduces dissipation in that only FET 17 can conduct responsive to A=L and only FET 18 can conduct responsive to A=H.) When B=H and $\overline{B}$=L on the other hand, the complementary-pair logic-inverter connection of FETs 17 and 18 is non-operative, since normal logic levels do not apply forward source-to-gate potential to either FET.

Beginning with the FIG. 3 configuration, consider now forms 20-1, 20-2, 20-3 the complemented latch circuit may take to facilitate its being programmed via terminal 11. In FIGS. 3 and 4 the B logic function is complemented to $\overline{B}$ by a complementary-pair logic inverter connection of p-channel, enhancement-mode FET 21 and n-channel, enhancement-mode FET 22. The logic levels H and L are identifiable with the positive and negative operating voltages $V_{DD}$ and $V_{SS}$, respectively, in FIG. 3 and the figures that follow. The derivation of B from programming voltages applied via terminal 11 involves the electrically-erasable programming process.

An n-channel FET 23 and a p-channel FET 24 of FIG. 3 are each of a type in which the threshold voltage of the FET is electrically programmable by the potential between its gate and another of its electrodes being substantially larger than the range of normal logic level swing. FET 23 and FET 24 are shown as being depletion-mode and enhancement-mode, respectively, in FIG. 3. That is, as they would be after a large voltage, substantially more positive than $V_{DD}$ in the case of gate-injection devices, or substantially more negative than $V_{SS}$ in the case of substrate-injection devices, has been most recently applied as programming voltage via terminal 11. The application of these large programming voltages of one polarity or the other is carried out before periods of normal operation. During such a programming period before a period of normal operation, to forestall possibilities of misprogramming, it is generally preferred practice to place $V_{SS}$, $V_{DD}$ and substrate connections at a reference potential against which programming voltages are referred. After programming, the $V_{SS}$, $V_{DD}$ and substrate connections are referred to the values shown for normal operation, and the potential on terminal 11 is constrained to the range between $V_{SS}$ and $V_{DD}$ inclusive. (This practice is mandatory with certain types of programmable-$V_T$ FETs.) In the period of normal operation illustrated by FIG. 3, FET 23 is conditioned to be so far into its depletion-mode conduction characteristics that its channel is in effect a short circuit to $V_{DD}$, no matter what value of A between L=$V_{SS}$ and H=$V_{DD}$ inclusive is applied to its gate during normal operation. FET 24 is conditioned to be so far into its enhancement-mode conduction characteristics that its channel is non-conductive, no matter what value of A between L=$V_{SS}$ and H=$V_{DD}$ inclusive is applied to its gate during normal operation. So, B=$V_{DD}$=H. Consequently, the complementary-pair logic inverter connection of FETs 21 and 22 responds to supply $\overline{B}$=$V_{SS}$=L. Annis gate 10 is conditioned by B=H and $\overline{B}$=L to be non-inverting, with output response C=A.

When the programming voltage last applied via terminal 11 to the gates of FETs 23 and 24 has been a large voltage, substantially more negative than $V_{SS}$ in the case of gate-injection devices or substantially more positive than $V_{DD}$ in the case of substrate-injection devices, FETs 23 and 24 will instead be conditioned to be strongly enhancement-mode and strongly depletion-mode, respectively. So strongly so, that for all values of A between L=$V_{SS}$ and H=$V_{DD}$ inclusive applied to the gates of FETs 23 and 24, the channel of FET 23 will be non-conductive and the channel of FET 24 will be a short circuit to $V_{SS}$. So, B=$V_{SS}$=L, and consequently $\overline{B}$=$V_{DD}$=H. Annis gate 10 is conditioned by B=L and $\overline{B}$=H to be inverting, with output response C=$\overline{A}$.

The latch connection of common-drain FETs 23 and 24 with gate-to-gate connection for receiving programming voltages and source-to-source connection as output connection, per FIG. 3, works with types of FET programmable by voltage between gate electrode and drain electrode, by voltage between gate electrode and joined drain and source electrodes, or by voltage between gate electrode and substrate. E.g., it works with gate-injection metal-oxide-semiconductor (GIMOS) FETs or with substrate-injection metal-oxide-semiconductor (SIMOS) FETs. This latch connection of FET's 23 and 24, the FIG. 3 complemented latch circuit, the FIG. 3 complemented latch circuit in combination with the complementary-pair transmission gate, and the FIG.

3 complemented latch circuit in combination with the complementary-pair inverter (from which combination FET 22 may also be omitted), as well as the dual of this last circuit, are aspects of the invention useful in themselves for implementing the design of circuitry other than that shown.

FIG. 4 shows a modification 20-2 of the FIG. 3 complemented latch circuit 20-1 wherein the latch configuration of common-drain FETs 23 and 24 interconnected at their source electrodes is replaced by a latch configuration of common-source FETs 25 and 26 inter-connected at their drain electrodes. FETs 25 and 26 are p-channel and n-channel, respectively, insofar as conduction type is concerned; and they have electrically alterable threshold voltages programmed by application of large programming voltage between their gate electrodes and their source electrodes (or possibly between their gate electrodes and their substrates). E.g., they may be GIMOS or SIMOS FETs. FETs 23 and 26 are shown as having been so strongly conditioned for enhancement-mode operation and for depletion-mode operation respectively that for $V_{SS} < A < V_{DD}$ the channel of FET 25 is non-conductive and the channel of FET 26 is in effect a short circuit to $V_{SS}$. This, in response to a programming voltage substantially more positive than $V_{DD}$ in the case of gate-injection devices, or substantially more negative than $V_{SS}$ in the case of substrate-injection devices. Responsive to a programming voltage substantially less negative than $V_{SS}$ in the case of gate injection devices, or substantially more positive than $V_{DD}$ in the case of substrate-injection devices, FET 26 can be programmed to be non-conductive and FET 25 can be programmed to be in effect a short circuit to $V_{DD}$. The latch circuit connection of FETs 25 and 26, the FIG. 4 complemented latch circuit in combination with the complementary pair inverter, as well as modifications of this circuit similar to those described with respect to its analog using the FIG. 3 complemented latch circuit in modified form are aspects of the invention useful in themselves for implementing the design of circuitry other than that shown.

FIG. 5 shows a complemented latch circuir 20-3 comprising the programmable latch connection of common-drain FETs 23 and 24 and the programmable latch connection of common-source FETs 25 and 26, both responding to programming voltages at terminal 11 to supply B and $\overline{B}$ to terminals 12 and 13, respectively, without need for a complementary-pair logic inverter. Assuming FETs 23, 24, 25 and 26 to be gate-injection types, and assuming the last applied programming voltage to be substantially more negative than $V_{SS}$, operation is as follows. The programming has biased p-channel FETs 23 and 26 strongly into enhancement-mode operation to open-circuit their channels for normal logic levels to their gates. The programming has biased n-channel FETs 24 and 25 strongly into depletion-mode operation, to short-circuit their channels for normal logic levels to their gates. A programming voltage substantially more positive than $V_{DD}$ can be used to open-circuit the channels of FETs 24 and 25 and short-circuit those of FETs 23 and 26 for application of normal logic levels to their gates. The FIG. 5 complemented latch circuit and the combinations of it with a complementary-pair transmission gate and with a complementary complementary-pair logic inverter are aspects of the invention useful in themselves for implementing the design of circuitry other than that shown.

The programmable latches 20-1, 20-2 and 20-3 can be modified to replace FETs 23, 24, 25 and 26 with FETs having threshold voltages programmable in response to programming voltage between their gate electrodes and their joined drain and source electrodes. To implement their programming, $V_{DD}$ and $V_{SS}$ during programming are each made equal to a reference potential, and the latch output connections are provided with a clamp to the reference potential. Such clamp can be provided by the selectively conductive channel of an FET rendered conductive only during programming.

Adaptations may be made to the FIG. 1 circuit which arrange its terminals 11 and 14 to be biased midway between $V_{SS}$ and $V_{DD}$ absent the application of either programming voltages or other input voltages to input terminal 11. This is advantageous when it is desired to selectively invert or not invert an analog signal, for example.

FIG. 6 illustrates how such adaptation can be made. Equal-value resistance 27 and 28 average either $\overline{B}$ and B or $V_{DD}$ and $V_{SS}$ to bias terminal 11 midway between $V_{SS}$ and $V_{DD}$. A resistance 29 provides for centering the quiescent voltage at terminal 14 midway between $V_{SS}$ and $V_{DD}$.

FIG. 7 shows a programmable latch 30 used to provide programmed A signal to the A input terminal 11 of Annis gate 10. A p-channel enhancement-mode FET 31 and an n-channel enhancement-mode FET 32 are connected as a complementary-pair logic inverter for generating $\overline{B}$ signal responsive to B signal, which B and $\overline{B}$ signals are applied to terminals 12 and 13 of Annis gate 10. Programmable latch 30 can receive programming voltages via its input connection 33 and B input signal can be applied directly from connection 33 to terminal 12; or, as shown in FIG. 7 programmable latch 30 can receive programming voltages and $\overline{B}$ input signal via a terminal 34, with the $\overline{B}$ signal at terminal 33 being inverted to provide B signal to terminal 12. This inversion is performed in FIG. 7 using the complementary-pair logic inverter connection of p-channel enhancement-mode FET 35 and n-channel enhancement-mode FET 36. The p-channel FET 37 and n-channel FET 38 in programmable latch 30 are preferably of the type having their $V_{TS}$ programmed responsive to programming voltages applied between their gate and source electrodes, when their channels are connected between $V_{DD}$ and $V_{SS}$ in the order shown in FIG. 7.

Modifications that can be made to the FIG. 7 configuration include the following ones. N-channel FET 32 can be omitted if $\overline{B}$ is supplied from terminal 33 to the gate of n-channel FET 16 in the transmission gate connection with p-channel FET 15, rather than being supplied from terminal 13. The order of the connecting of the external circuit to terminals 12 and 13 of Annis gate 10 can be reversed; and this modification can be carried further either to connect terminals 13 and 34 and eliminate FETs 35 and 36, or to eliminate FET 31 by connecting the gate of FET 15 to terminal 34 rather than to terminal 13.

Variants of FIG. 7 or of any of its foregoing modifications are feasible in which there is reversal in programming latch 30 of the positions of the channels of programmable-threshold-voltage p-channel FET 37 and of programmable-threshold-voltage n-channel FET 38. The FETs 37 and 38 must then be types with $V_{TS}$ programmable in response to programming voltages applied between gate and drain. There will be an attendant reversal of the polarity programming voltages to establish either output condition of the programmable latch.

Arrangements can be made for clamping the source and drain electrodes of the FETs 37 and 38 during their programming, to allow each to be of a type programmed by voltage between its gate and the one of its source and drain electrodes not directly connected to a supply voltage. During programming the $V_{DD}$ and $V_{SS}$ will both be made equal to a reference voltage.

In the programmable latch circuits embodying the invention as thus far described, alternative connection of an output terminal to $V_{SS}$ or to $V_{DD}$ has been made using a pair of programmable-$V_T$ transistors of complementary conductivity types, but of similar programming type. Programmable latch circuits embodying the invention can make alternative connection of an output terminal to $V_{SS}$ or to $V_{DD}$ using a pair of programmable-$V_T$ transistors of similar conductivity type, but of complementary programming types.

Figure 8:
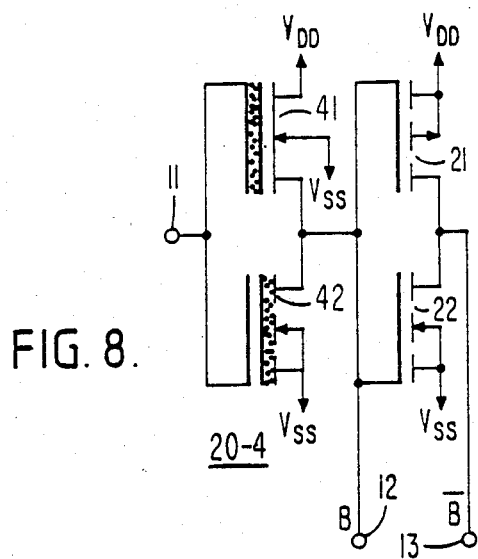

An n-channel GIMOS FET 41 and an n-channel SIMOS FET 42 of FIG. 8 are each of a type in which the threshold voltage of the FET is electrically programmable by the potential between its gate and another of its electrodes being substantially larger than the range of normal logic level swing. FET 41 and FET 42 are shown as being depletion-mode and enhancement-mode, respectively, in FIG. 8 as they would be after a large voltage, substantially more positive than $V_{DD}$ has been most recently applied as programming voltage via terminal 11. FET 41 is conditioned to be so far into depletion-mode conduction characteristics that its channel is in effect a short circuit to $V_{DD}$, no matter what value of A between $L=V_{SS}$ and $H=V_{DD}$, inclusive, is applied to its gate. FET 42 is conditioned to be so far into its enhancement-mode conduction characteristics that its channel is non-conductive, no matter what value of A between $L=V_{SS}$ and $H=V_{DD}$, inclusive is applied to its gate. So, $B=V_{DD}=H$. Consequently, the complementary-pair logic inverter connection of FETs 21 and 22 responds to supply $\overline{B}=V_{SS}=L$. Annis gate 10 is conditioned by $B=H$ and $\overline{B}=L$ to be non-inverting, with output response $C=A$.

When the programming voltage last applied via terminal 11 to the gates of FETs 41 and 42 has been a large voltage, substantially more negative than $V_{SS}$, however, FETs 41 and 42 will be continued to be strongly enhancement-mode and strongly depletion-mode, respectively. So strongly so, that for all values of A between $L=V_{SS}$ and $H=V_{DD}$, inclusive, applied to the gates of FETs 41 and 42, the channel of FET 41 will be non-conductive and the channel of FET 42 will be a short circuit to $V_{SS}$. So, $B=V_{SS}=L$, and consequently $\overline{B}=V_{DD}=H$. Annis gate 10 is conditioned by $B=L$ and $\overline{B}=H$ to be inverting, with output response $C=\overline{A}$.

GIMOS FET 41 preferably has its floating gate structure so made that the device is programmably responsive to programming voltage between gate and drain electrodes, without need for clamping terminal 12 (to which its source connects) to a reference voltage during programming. SIMOS FET 42 preferably has its floating gate structure so made that the device is programmably responsive to programming voltage between gate and source electrodes, or gate and substrate electrodes, without need for clamping terminal 12 (to which its drain connects) to a reference voltage during programming. Where the GIMOS FET 41 is of a type the source electrode of which must be clamped to a reference potential during programming, or where the SIMOS FET 42 is of a type the drain electrode of which must be clamped to potential during programming, the clamp is simply provided by the selectively conductive channel of an FET rendered conductive responsive to a control signal applied to its gate electrode during programming. An FET of suitable conductivity type and high enough effective threshold voltage (of its own or aided by a potential-offsetting device in its gate connection) can have the programming voltage at terminal 11 applied as this control signal. The latch connection of FETs 41 and 42, the FIG. 8 complemented latch circuit, the FIG. 8 complemented latch circuit in combination with the complementary-pair transmission gate, and the FIG. 8 complemented latch circuit in combination with the complementary-pair inverter (from which combination FET 22 may also be omitted), are aspects of the invention useful in themselves for implementing the design of circuitry other than that shown.

Figure 9:
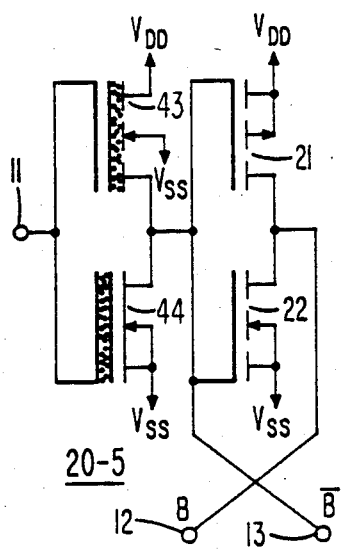

FIG. 9 shows a modification 20-5 of the FIG. 8 complemented latch circuit 20-4 wherein the latch configuration of common-drain GIMOS FET 41 and common-source SIMOS FET 42 is replaced by a latch configuration of common-drain SIMOS FET 43 and common-source GIMOS FET 44. FETs 43 and 44 are both n-channel. SIMOS FET 43 preferably has its floating gate so made that the transistor is responsive to programming voltage between gate and drain electrodes, and GIMOS FET 44 preferably has its floating gate so made as to be responsive to programming voltage between gate and source electrodes; this makes clamping of the interconnection node between FETs 43 and 44 unnecessary. FETs 43 and 44 are shown as having been so strongly conditioned for enhancement-mode operation and for depletion-mode operation respectively that for $V_{SS} < A < V_{DD}$ the channel of FET 44 is in effect a short circuit to $V_{SS}$. This, in response to a programming voltage substantially more positive than $V_{DD}$. Responsive to a programming voltage substantially more negative than $V_{SS}$, FET 44 can be programmed to be non-conductive and FET 43 can be programmed to be in effect a short circuit to $V_{DD}$. The latch circuit connection of FETs 43 and 44, the FIG. 9 complemented latch circuit, the FIG. 9 complemented latch circuit in combination with the complementary pair inverter are aspects of the invention useful in themselves for implementing the design of circuitry other than that shown.

Figure 10:
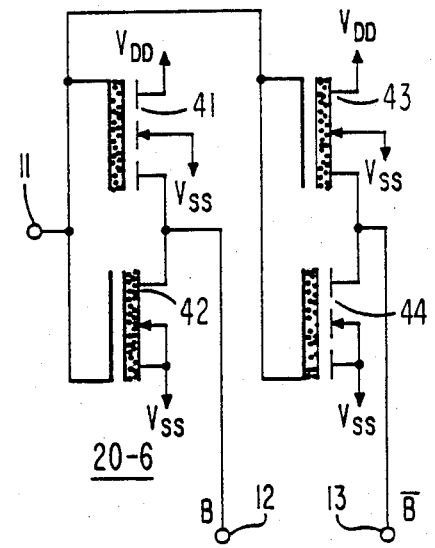

FIG. 10 shows a complemented latch circuit 20-6 comprising the programmable latch connection of FETs 41 and 42 and the programmable latch connection of FETs 43 and 44, both responding to programming voltages at terminal 11 to supply B and $\overline{B}$ to terminals 12 and 13, respectively, without need for a complementary-pair logic inverter. The last applied programming voltage, substantially more positive the $V_{DD}$, has biased FETs 41 and 44 strongly into enhancement-mode operation to open-circuit their channels for normal logic levels at their gates and has biased FETs 42 and 43 strongly into depletion-mode operation to short-circuit their channels for normal logic levels at their gates. A programming voltage substantially more negative than $V_{SS}$ can be used to open-circuit the channels of FETs 42 and 43 and short-circuit those of FETs 41 and 44 for application of normal logic levels to their gates. The FIG. 10 complemented latch circuit and the combinations of it with a complementary-pair transmission gate and with a complementary-pair logic inverter are aspects of the invention useful in themselves for implementing the design of circuitry other than that shown.

Figure 11:
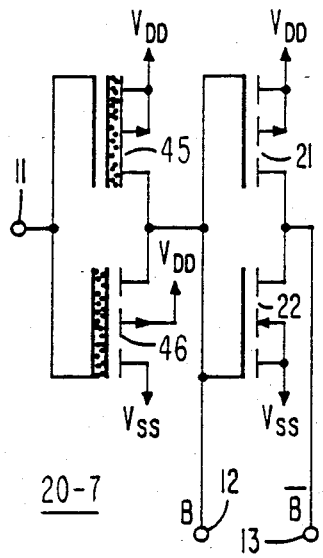
Figure 12:
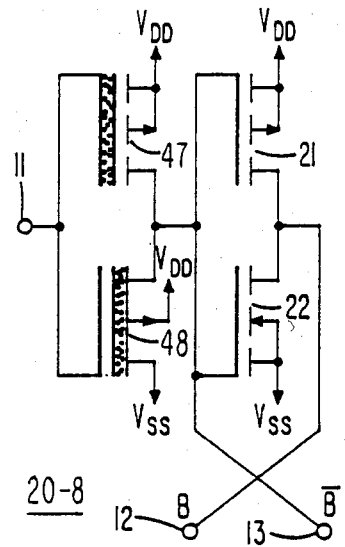
Figure 13:
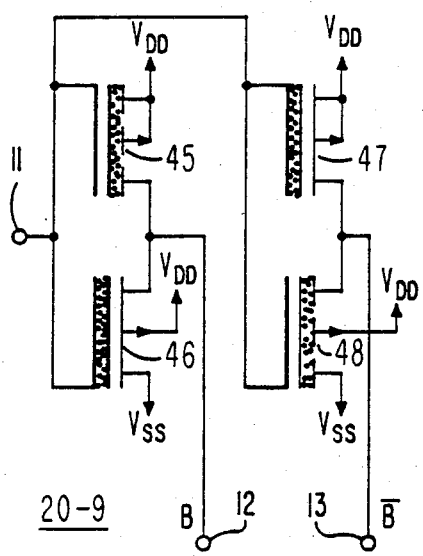

The FIGS. 8, 9 and 10 programmable latches 20-4, 20-5 and 20-6 each use n-channel programmable-threshold-voltage transistors; and they have homologs 20-7, 20-8 and 20-9 using p-channel programmable-threshold-voltage transistors 45, 46, 47 and 48 as shown in FIGS. 11, 12 and 13, respectively.

Like the programmable latches 20-1, 20-2 and 20-3 of FIGS. 3, 4 and 5, the programmable latches of FIGS. 8, 9, 10, 11, 12 and 13 are advantageous in that they consume no appreciable power except during programming.

In FIG. 10 the n-channel FETs of SIMOS type may both be replaced by p-channel FETs of GIMOS type, or the n-channel FETs of GIMOS type may both be replaced by p-channel FETs of GIMOS type, or the p-channel FETs of GIMOS type may both be replaced by n-channel FETs of SIMOS type.

In the claims which follow, the class of metal-insulator-semiconductor transistors specified as being of gate-injection type is to be construed to include other programmable-threshold-voltage FETs with conduction characteristics electrically programmed and erased similarly to GIMOS FET; such as programmable injection (PIMOS) types and the class of metal-insulator-semiconductor transistors specified at being of substrate-injection type is to be construed to include other programmable-threshold-voltage FETs with conduction characteristics electrically programmed and erased similarly to SIMOS FETs.

What is claimed is:

1. In an integrated circuit including a number of circuit elements, first and second terminals for receiving an operating potential therebetween, and at least a third further terminal utilized during normal operation of said elements of said integrated circuit to receive voltage within a prescribed range for normal operation, the improvement comprising:

an electrically erasable programmable latch circuit included in addition to said number of circuit elements within said integrated circuit, said programmable latch circuit receiving at a time prior to said normal operation a programming voltage applied between said first and third terminals, which programming voltage is outside said prescribed range for normal operation, which programming voltage of a first polarity establishes a first output voltage condition for said programmable latch circuit during normal operation, and which programming voltage of a second polarity opposite said first polarity establishes a second output voltage condition for said programmable latch circuit during normal operation said first output voltage condition being one in which the programmable latch output voltage is close to that voltage received at said first terminal during normal operation, and said second output voltage condition being one in which the programmable latch output voltage is close to that voltage received at said second terminal during normal operation;

means within said integrated circuit responsive to said first output voltage condition being supplied thereto from said programmable latch circuit for connecting ones of said elements of integrated circuit in a first circuit configuration; and means within said integrated circuit responsive to said second output voltage condition being supplied thereto from said programmable latch circuit for connecting ones of said elements of said integrated circuit in a second circuit configuration, said second circuit configuration differing from said first circuit configuration.

2. In an integrated circuit including at least first and second subcircuits, first and second terminals for receiving an operating potential therebetween which operating potential is applied to at least one of said subcircuits, and at least a third further terminal connected to one of said subcircuits and utilized during normal operation of said subcircuits of said integrated circuit to receive voltage within a prescribed range for normal operation, the improvement comprising:

an electrically erasable programmable latch circuit within said integrated circuit receiving at a time prior to said normal operation a programming voltage applied between said first and third terminals, which programming voltage is outside said prescribed range for normal operation, which programming voltage if of a first polarity establishes a first output voltage condition for said programmable latch circuit during normal operation, and which programming voltage if of a second polarity opposite said first polarity establishes a second output voltage condition for said programmable latch circuit during normal operation, said first output voltage condition being one in which the programmable latch output voltage is close to that voltage received at said first terminal during normal operation, and said second output voltage condition being one in which the programmable latch output voltage is close to that voltage received at said second terminal during normal operation;

means within said integrated circuit responsive to said first output voltage condition being supplied thereto from said programmable latch circuit for completing connection of said first subcircuit between said first and second terminals; and means within said integrated circuit responsive to said second output voltage condition being supplied thereto from said programmable latch circuit for interrupting said connection of said first subcircuit between said first and second terminals.

3. In an integrated circuit including first and second terminals for receiving an operating potential therebetween and at least a third further terminal utilized during normal operation of said integrated circuit to receive voltage within a prescribed range for normal operation, the improvement comprising:

a electrically erasable programmable latch circuit within said integrated circuit receiving at a time prior to said normal operation a programming voltage applied between said first and third terminals, which programming voltage is outside said prescribed range for normal operation, which programming voltage if of a first polarity establishes a first output voltage condition for said programmable latch circuit during normal operation, and which programming voltage if of a second polarity opposite said first polarity establishes a second output voltage condition for said programmable latch circuit during normal operation said first output voltage condition being one in which the programmable latch output voltage is close to that voltage received at said first terminal during normal operation, and said second output voltage condition being one in which the programmable latch output voltage is close to that voltage received at said second terminal during normal operation;

means within said integrated circuit, responsive to said first output voltage condition being supplied thereto from said programmable latch circuit, for completing a connection between first and second nodes; and means within said integrated circuit, responsive to said second output voltage condition being supplied thereto from said programmable latch circuit, for interrupting said connection between first and second nodes.

* * * * *